(12) United States Patent
Moitzi et al.

(10) Patent No.: US 11,324,122 B2
(45) Date of Patent: May 3, 2022

(54) COMPONENT CARRIER AND METHOD OF MANUFACTURING THE SAME

(71) Applicant: AT&S Austria Technologie & Systemtechnik Aktiengesellschaft, Leoben (AT)

(72) Inventors: Heinz Moitzi, Zeltweg (AT); Johannes Stahr, St. Lorenzen im Mürztal (AT); Mike Morianz, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/948,937

(22) Filed: Oct. 6, 2020

(65) Prior Publication Data
US 2021/0112666 A1    Apr. 15, 2021

(30) Foreign Application Priority Data

Oct. 14, 2019   (EP) .................................... 19203022

(51) Int. Cl.
| | |
|---|---|
| *H05K 1/02* | (2006.01) |
| *H05K 1/05* | (2006.01) |
| *H05K 1/18* | (2006.01) |
| *H05K 3/44* | (2006.01) |

(52) U.S. Cl.
CPC ........... *H05K 1/188* (2013.01); *H05K 1/0203* (2013.01); *H05K 1/056* (2013.01); *H05K 3/44* (2013.01)

(58) Field of Classification Search
CPC .. H05K 1/0201; H05K 1/0203; H05K 1/0204; H05K 1/0207; H05K 1/0209; H05K 1/021; H05K 1/056; H05K 1/118
See application file for complete search history.

(56) References Cited

U.S. PATENT DOCUMENTS

| | | | |
|---|---|---|---|
| 6,709,898 B1 * | 3/2004 | Ma ...................... | H01L 23/3128 257/675 |
| 7,112,885 B2 * | 9/2006 | Chen .................... | H05K 1/0274 257/722 |

(Continued)

FOREIGN PATENT DOCUMENTS

| | | |
|---|---|---|
| CR | 102300417 B | 9/2013 |
| DE | 102015120745 A1 | 6/2017 |
| DE | 102105120745 A1 | 6/2017 |

OTHER PUBLICATIONS

Schweiger, D.; Extended European Search Report in Application 19203022.9, dated Apr. 28, 2020; pp. 1-8; European Patent Office, 80298, Munich, Germany.

*Primary Examiner* — Hoa C Nguyen
(74) *Attorney, Agent, or Firm* — Robert A. Blaha; Smith Tempel Blaha LLC

(57) ABSTRACT

A component carrier includes a stack having at least one electrically insulating layer structure and/or at least one electrically conductive layer structure; a heat removing and electrically conductive base structure; a component which is connected to the base structure so as to at least partially protrude from the base structure and so as to be laterally at least partially covered by an electrically insulating material of the stack; and an electrically conductive top structure on or above a top main surface of the component. A method of manufacturing such a component carrier is disclosed.

14 Claims, 15 Drawing Sheets

(56) References Cited

U.S. PATENT DOCUMENTS

| | | | | |
|---|---|---|---|---|
| 8,420,954 B2* | 4/2013 | Lin | ............... | H05K 1/0272 |
| | | | | 174/266 |
| 8,811,019 B2* | 8/2014 | Gottwald | ............. | H05K 3/30 |
| | | | | 361/719 |
| 9,491,864 B2* | 11/2016 | Ma | ............. | H01L 23/66 |
| 9,659,837 B2* | 5/2017 | Tolentino | ............. | H01L 21/56 |
| 9,860,990 B1* | 1/2018 | Lee | ............. | H05K 1/021 |
| 2007/0076391 A1* | 4/2007 | Hsu | ............. | H01L 24/19 |
| | | | | 361/763 |
| 2018/0019178 A1 | 1/2018 | Lin et al. | | |

* cited by examiner

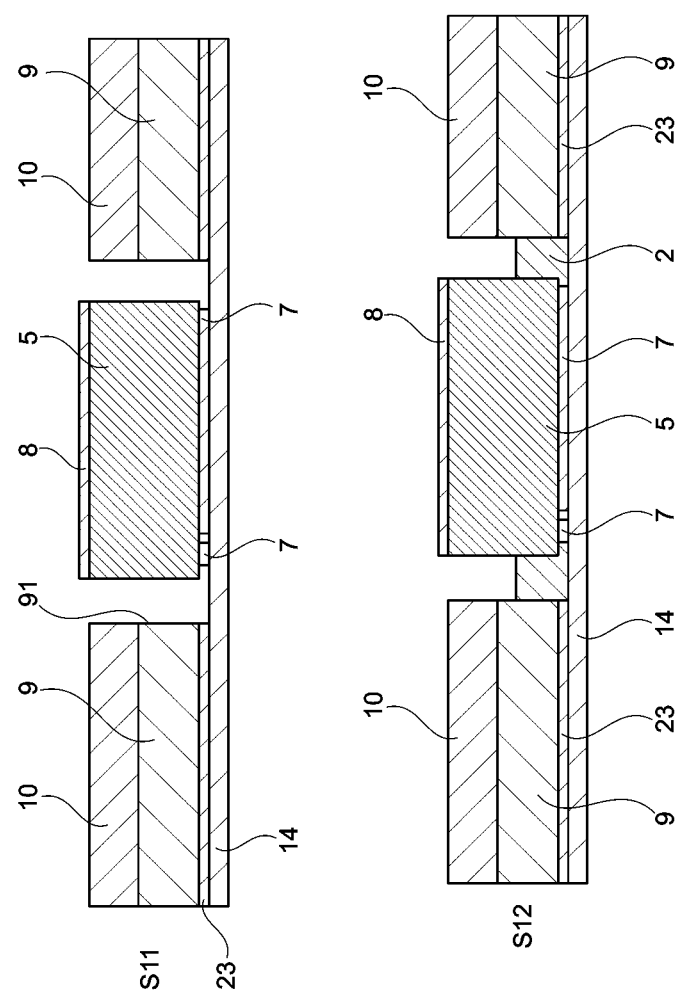

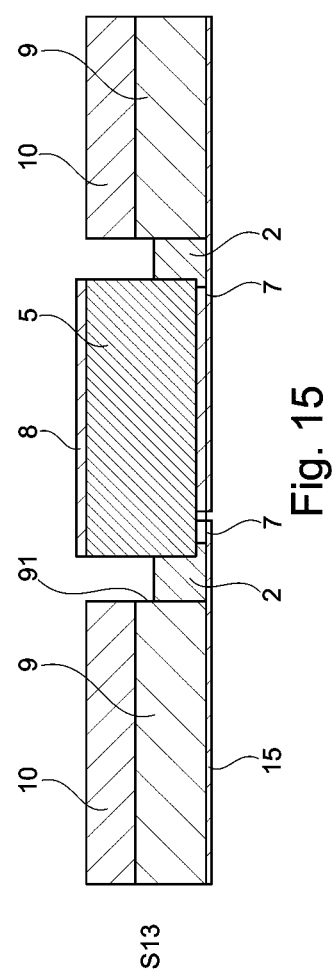
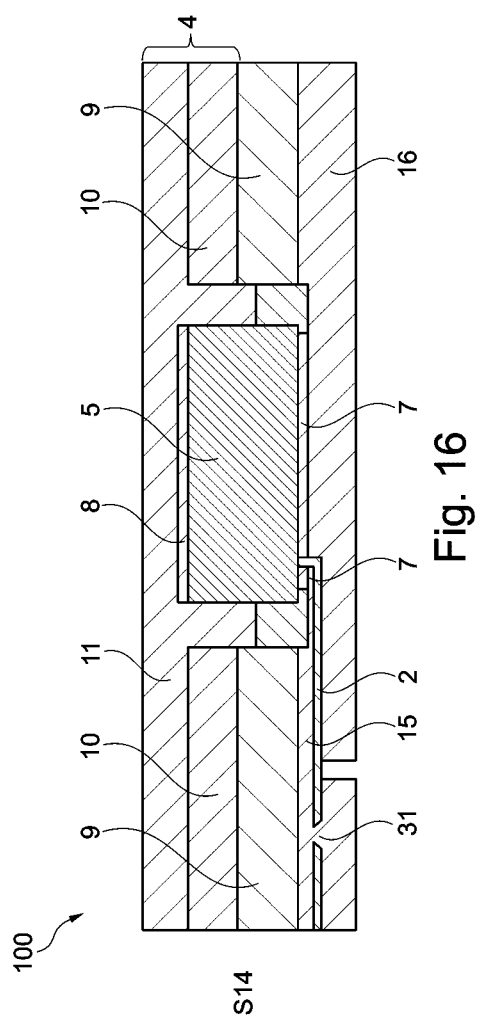

COMPONENT CARRIER AND METHOD OF MANUFACTURING THE SAME

TECHNICAL FIELD

The invention relates to a component carrier and to a method of manufacturing the same.

TECHNOLOGICAL BACKGROUND

A conventional component carrier comprises a stack having an electrically insulating layer structure and an electrically conductive layer. A component is surface-mounted on or embedded in the stack. Such component carrier can be used in the field of automotive semiconductor applications with high vertical currents. Due to the high vertical currents, heat is generated which may lead to overheating and thus to a failure of the component carrier or the component therein.

SUMMARY

There may be a need to provide a component carrier and a method of manufacturing the same, by which an effective thermal management can be achieved when high vertical currents flow through the component carrier.

According to an exemplary embodiment of the invention, a component carrier comprises a stack comprising at least one electrically insulating layer structure and/or at least one electrically conductive layer structure, a heat removing and electrically conductive base structure, a component which is connected to or in a direct contact with the base structure so as to at least partially protrude from the base structure and so as to be laterally at least partially covered by an electrically insulating material of the stack, and an electrically conductive top structure on or above a top main surface of the component.

According to another exemplary embodiment of the invention, a method of manufacturing a component carrier comprises steps of providing a stack comprising at least one electrically insulating layer structure and/or at least one electrically conductive layer structure, forming a heat removing and electrically conductive base structure, connecting a component to the base structure so that the component at least partially protrudes from the base structure and is covered on its sidewalls at least partially by an electrically insulating material of the stack, and forming an electrically conductive top structure electrically contacting a top main surface of the component.

OVERVIEW OF EMBODIMENTS

In the context of the present application, the term "partially protrude" can mean that a part of the component is embedded in the base structure and the remaining part of the component protrudes from the base structure.

In the context of the present application, the term "main surface" can refer to a surface of the component where electric terminals are arranged. The term "main surface" can also refer to a surface of component which is perpendicular to a direction in which layers of the stack are arranged or layered one upon the other.

In the context of the present application, the term "top main surface" can refer to a main surface of the component where a source terminal of the component is arranged. The term "top main surface" can also refer to that main surface of the component which is opposite to a main surface of the component which is embedded in or connected to the base structure. The term "top main surface" can also refer to that main surface of the component which is first inserted into a cavity of the component carrier during a manufacturing process.

The component carrier with the above-mentioned configuration exhibits improved heat spreading from the component, in particular by the heat removing and electrically conductive base structure. High currents flowing vertically through the component carrier can be realized, and an effective thermal management by heat spreading can be achieved. The component carrier of the present invention can be used in applications of about 50 kW, for example in the field of automotive semiconductor applications.

The top structure improves the rigidity of the component carrier.

In the following, further exemplary embodiments of the present invention will be explained.

In an embodiment, the component is connected to the base structure for heat spreading, in particular at least with a heat spreading angle of 45°. For example, the heat spreading angle can be measured between a vertical lateral side of the component and a line in the base structure, which confines an area of substantial heat transfer. At this line, a temperature gradient measured in the horizontal direction can exhibit a maximum. The angular point of the heat spreading angle can be that point at the lateral side of the component where a transition of the base structure to the electrically insulating material of the stack takes place.

In an embodiment, the base structure has a thickness of larger than 100 μm, in particular larger than 130 μm; and/or the top structure has a thickness of at least 50 μm, in particular at least 70 μm; and/or the top structure has a thickness being smaller than a thickness of the base structure. The thicknesses can be measured in a direction perpendicular to a main surface of the component carrier. Heat spreading can be further improved by these parameters.

In an embodiment, the component has at least one terminal at a top main surface and at least one terminal at a bottom main surface, wherein the at least one terminal at the bottom main surface is connected to the base structure and the at least one terminal on the top surface is connected to the top structure. The term "connected" in this context can include an electrical and/or a thermal connection or link.

In an embodiment, the component is laterally surrounded at least partially by a core to further improve the rigidity.

In an embodiment, the base structure is composed of a copper foil and a layer of galvanic copper. In an embodiment, the top structure comprises a copper foil. Thereby, the manufacture of the component carrier can be facilitated under less costs.

In an embodiment, at least 10% of a sidewall of the component is covered with a material of the base structure; and/or at least 10% of a sidewall of the component is covered with the electrically insulating material of the stack. That means, at least 10% of a height of the sidewall of the component can be contiguously covered with a material of the base structure; and/or at least 10% of a height of the sidewall of the component can be contiguously covered with the electrically insulating material of the stack. On the one hand, the thermal resistance is reduced by enlarging the contact interface to the semiconductor, because the side walls are partly plated with copper, for example. On the other hand, the electrically insulating material of the stack covers a part of lateral surfaces of the component so as to prevent electro migration or a disruptive discharge from the terminals of the component.

In an embodiment, a patterned adhesive or sintered layer is arranged within the base structure and provides an electric and/or thermal contact for the component. Thereby, the manufacture of the component carrier can be facilitated.

In an embodiment, the component carrier comprises at least one of the following features: the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In an embodiment of the method, an inner component carrier is formed on panel level in the step of connecting the component to the base structure, and the inner component carrier is embedded on panel level in a cavity of an outer component carrier.

In the context of the present application, the term "panel level" can refer to manufacturing processes such as panel-level-packaging which are carried out on a so called panel. Such panels can have a rectangular format of 300×300 mm², 500×500 mm², 600×600 mm², etc. Manufacturing methods on panel level are usually used in the PCB (printed circuit board) technologies. In contrast to manufacturing methods on panel level, there are manufacturing methods on wafer level which are carried out on a circular (semiconductor) wafer.

For example, according to the present invention, the inner component carrier as a PCB lead frame with the component can be integrated into a lower cost PCB. With this concept, a cost saving solution is given by prefabrication of embedded components in an inner PCB lead frame on panel level with utilization of semiconductors as components. The concept enables to create thick copper lead frames with common embedding technologies and PCB technologies to form the inner component carrier and realizes a fully packaged component. The manufacturing method can be split into manufacturing a high current PCB (inner component carrier) and a low cost PCB (outer component carrier) with higher routing densities. The cost efficiency is improved due to the implementation of a relative costly lead frame (inner component carrier) with the fully packaged component into the cheaper and simple outer PCB (outer component carrier).

Furthermore, a known-good-package (KGP) test capability of 100% of the inner component carrier can be achieved before integrating the same into the outer component carrier such as a final PCB build.

In an embodiment of the method, the component carrier is manufactured by use of a temporary carrier, in particular a sticky tape, being temporarily attached to a main surface of the component relating to the top structure.

In an embodiment of the method, the component carrier is manufactured by use of a temporary carrier, in particular a sticky tape, being temporarily attached to a main surface of the component corresponding to the base structure.

In an embodiment of the method, the component carrier is manufactured by a batch process on panel level.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be, in relation to a PCB, a comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 14 illustrates steps of a base concept of manufacturing an inner component carrier according to an exemplary embodiment.

FIG. 15 illustrates a step of the base concept of manufacturing the inner component carrier according to the exemplary embodiment.

FIG. 16 illustrates a step of the base concept of manufacturing the inner component carrier according to the exemplary embodiment.

DETAILED DESCRIPTION OF THE ILLUSTRATED EMBODIMENTS

Figure 1:
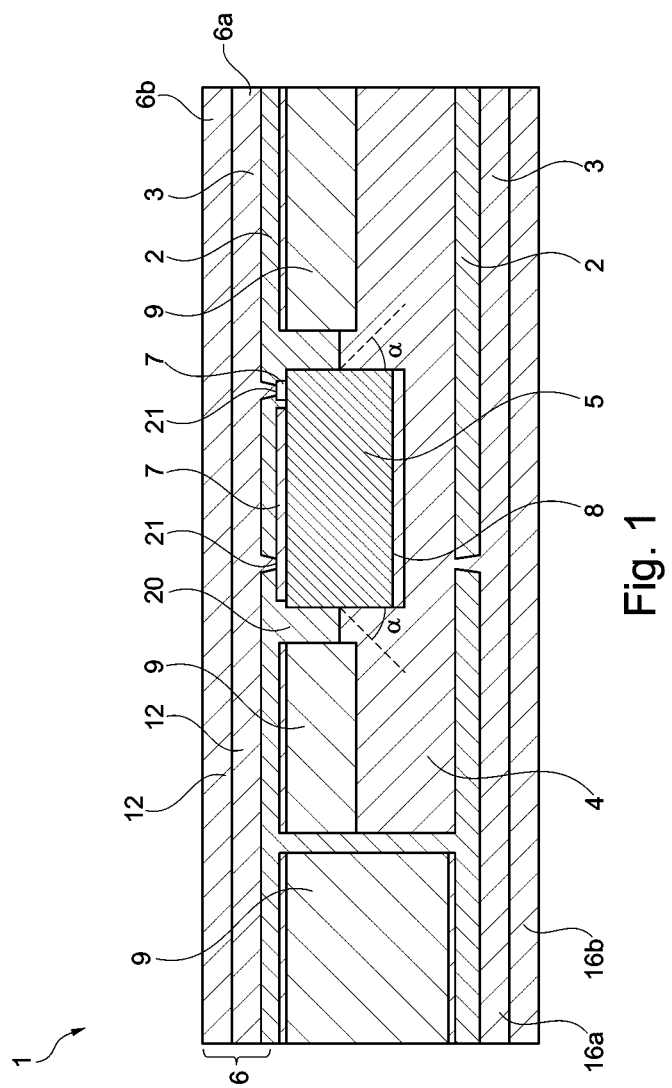
FIG. 1 illustrates a cross-sectional view of a component carrier according to an exemplary embodiment of the invention.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 can be shaped as a plate. The component carrier 1 can be configured as one of the group consisting of a printed circuit board, a substrate, and an interposer. The component carrier 1 can be configured as a laminate-type component carrier.

The component carrier 1 comprises a stack comprising at least one electrically insulating layer structure 2 and at least one electrically conductive layer structure 3.

The electrically insulating layer structure 2 can comprise at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

The at least one electrically conductive layer structure 3 of the component carrier can comprise at least one of the group consisting of copper, aluminum, nickel, silver, gold, palladium, and tungsten, any of the mentioned materials being optionally coated with supra-conductive material such as graphene.

The component carrier 1 further comprises a heat removing and electrically conductive base structure 4 which can form a kind of lead frame manufactured by PCB technologies, a component 5 which is connected to or arranged in a direct contact with the base structure 4 so as to at least partially protrude from the base structure 4 and so as to be laterally at least partially covered by an electrically insulating material of the stack, and an electrically conductive top structure 6 on or above a top main surface of the component 5.

The component carrier 1 with the above-mentioned configuration exhibits improved heat spreading from the component 5, in particular by the heat removing and electrically conductive base structure 4. High currents flowing vertically through the component carrier 1 can be realized, and an effective thermal management by heat spreading can be achieved. The component carrier 1 can be used in applications of about 50 kW, for example in the field of automotive semiconductor applications. The base structure 6 is connected to the component 5 for heat spreading, in particular with a heat spreading angle α of 45°.

The top structure 6 improves the rigidity of the component carrier 1. The top structure 6 comprises a base copper layer 6a which can be a copper foil adhered or laminated on the electrically insulating layer structure 2 above the component 5. On the base copper layer 6a, a copper layer 6b is arranged by electroplating (galvanic copper). Alternatively, the base copper layer 6a can be a relative thin copper layer (seed layer). The thin copper layer 6a can be applied chemically, electroless or by sputtering. On the thin copper layer 6a, a thicker copper layer 6b can be arranged by electroplating (galvanic copper). The copper layers 6a, 6b can have a thickness of 50 to 100 µm, preferable of 70±5 µm, respectively.

The component 5 is embedded in the component carrier 1. The component 5 can be in particular selected from a group consisting of a power semiconductor component, in particular a power transistor chip, an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

The component 5 has two terminals 7 at a top main surface and one terminal 8 at a bottom main surface, wherein the terminal 8 at the bottom main surface is connected to the base structure 4 and the terminals 7 on the top surface are connected to the top structure 6. The term "connected" in the present context can include an electrical as well as a thermal link.

The component 5 is laterally at least partially surrounded by a core 9. The core 9 can have a thickness of about 70 to 150 µm, preferably of 100 µm±5 µm.

The base structure 4 can have a thickness, which is measured in a direction perpendicular to a main surface of the component carrier 1, of larger than 100 µm, in particular larger than 130 µm; and the top structure 6 can have a thickness of at least 50 µm, in particular of at least 70 µm; and the top structure 6 can have a thickness being smaller than a thickness of the base structure 4.

At least 10% of a height of a sidewall of the component 5 can be contiguously covered with a material of the base structure 4, for example 100 µm of the sidewall of the component 5 can be contiguously covered with the material of the base structure 4. At least 10% of a height of the sidewall of the component 5 can be contiguously covered with the electrically insulating material of the stack.

The component carrier 1 further comprises a bottom structure 16a, 16b having a base copper layer 16a which can be a copper foil adhered or laminated on an electrically insulating layer structure 2 below the component 5. On the base copper layer 16a, a copper layer 16b is arranged by electroplating (galvanic copper). Alternatively, the base copper layer 16a can be a relatively thin copper layer (seed layer). The thin copper layer 16a can be applied chemically, electroless or by sputtering. On the thin copper layer 16a, a thicker copper layer 16b can be arranged by electroplating (galvanic copper). The copper layers 16a, 16b can have a thickness of 50 to 100 µm, preferable of 70±5 µm, respectively.

In summary, the component carrier 1 with the above-mentioned configuration exhibits an improved heat spreading from the component 5, in particular by the heat removing and electrically conductive base structure 4. The top structure 6 improves the rigidity of the component carrier 1.

Figure 2:
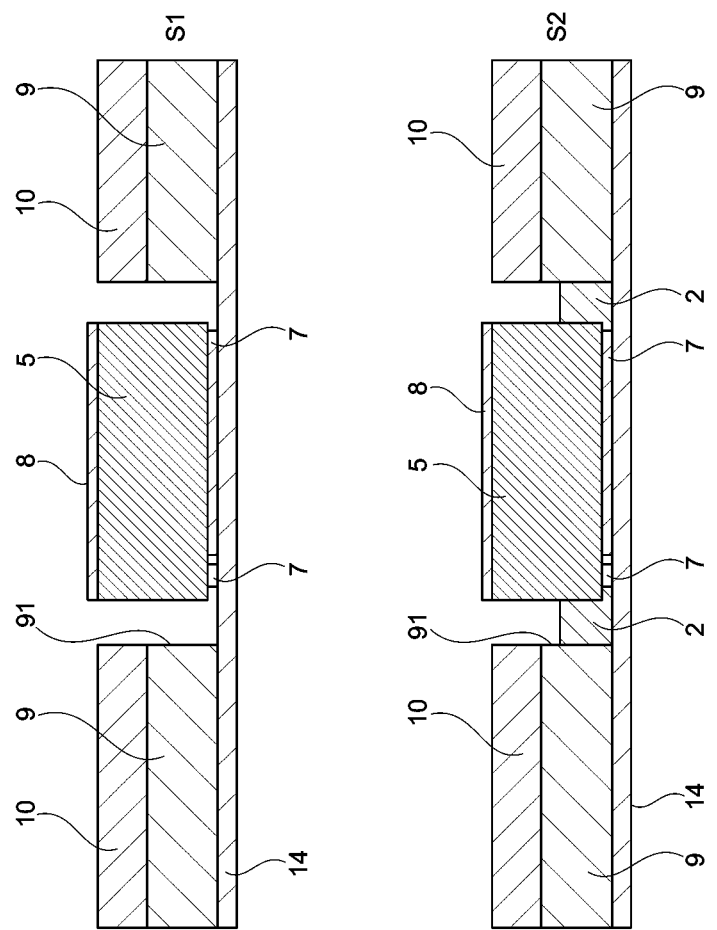
FIG. 2 illustrates steps of a base concept of manufacturing an inner component carrier according to an exemplary embodiment.
Figure 3:
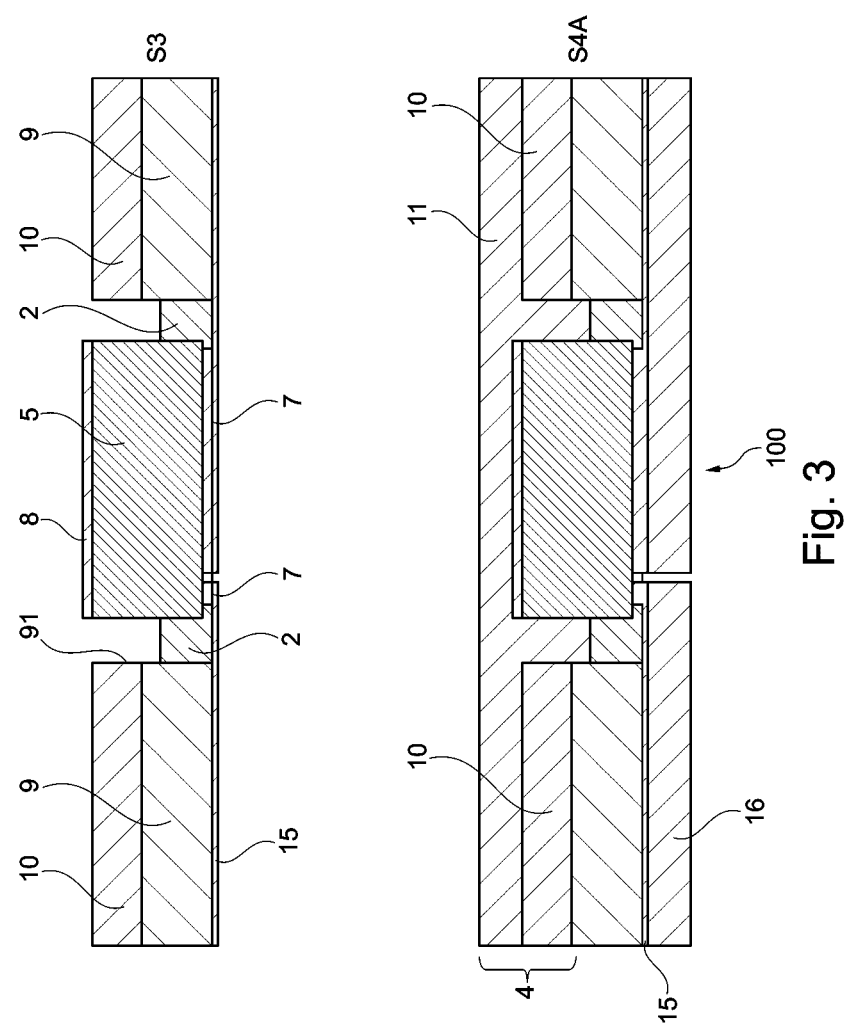
FIG. 3 illustrates steps of the base concept of manufacturing the inner component carrier according to the exemplary embodiment.
Figure 4:
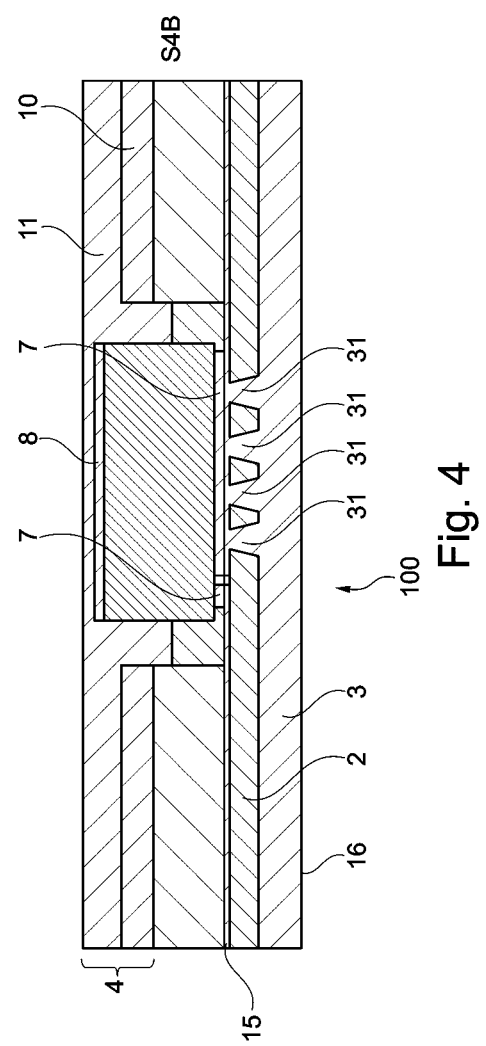
FIG. 4 illustrates an alternative step of the base concept of manufacturing the inner component carrier according to the exemplary embodiment.

FIGS. 2 to 4 illustrate steps of a base concept of manufacturing an inner component carrier 100 according to an exemplary embodiment, where a component 5 is connected to a base structure 4.

In a step S1, a core 9 made of an insulating material is provided, which has a cavity 91. The cavity 91 in the core 9 can be provided by mechanically drilling. A copper layer 10 is arranged on the core 9. The copper layer 10 can have a thickness for example of 70 µm. The copper layer 10 can be a copper foil. The core 9 with the copper layer 10 thereon can be a prefabricated board. The core 9 might originally have another copper layer (not shown) at the side opposite to the copper layer 10. In the embodiment of FIG. 2, this non-shown other copper layer has been etched away to reduce the thickness of the inner component carrier 100.

A temporary carrier 14, in particular a sticky tape, is attached to the core 9 at a side opposite to that side where the copper layer 10 is arranged.

A component 5 is placed on the temporary carrier 14 within the cavity 91. In the present embodiment, the component 5 is a MOSFET having a drain terminal 8 at one side and a source terminal 7 and a gate terminal 7 at the opposite side. The component 5 is placed with its source terminal 7 and its gate terminal 7 onto the temporary carrier 14 within the cavity 91 so that the drain terminal 8 is exposed at the top. The component 5 is placed face-down in the cavity 91, thus the source terminal 7 and the gate terminal 8 are arranged on the temporary carrier 14.

In a step S2, the component 5 is fixed by a material of an electrically insulating layer structure 2 in the cavity 91. This material of the electrically insulating layer structure 2 can be an adhesive or a molding material. Alternatively, if the board comprising the core 9 and the copper layer 10 is made of a prepreg material, the board can be laminated by means of pressure and/or heat so that the prepreg material of the core 9 is molten and enters the cavity 91. After curing the prepreg material of the core 9, the component 5 is fixed within the cavity 91.

On the one hand, the electrically insulating layer structure 2, which is described in step S2, does not cover the entire lateral surfaces of the component 5 so as to reserve a space which can later be filled by a thermal conductive material in order to improve the heat spreading. Alternatively, it is conceivable to remove a part of the electrically insulating layer structure 2, which is described in step S2, for example by etching, plasma etching, or a laser process.

The electrically insulating layer structure 2, which is described in step S2, covers a part of lateral surfaces of the component 5 so as to prevent electro migration or a disruptive discharge from the terminals 7 of the component 5.

In a step S3, the temporary carrier 14 is removed. In place of the temporary carrier 14, a thin copper layer 15 (seed layer) is applied to the core 9, the electrically insulating layer structure 2 and the terminals 7 of the component 5. The thin copper layer 15 can be applied chemically, electroless or by sputtering.

The thin copper layer 15 can be composed of two horizontally extending regions, wherein a first region (at the left-hand side in step S3 of FIG. 3) is connected to the gate terminal 7 of the component 5, that means a gate line is realized in the thin copper layer 15. A second region (at the right-hand side in step S3 of FIG. 3) of the thin copper layer 15 is connected to the source terminal 7 of the component 5.

The first and the second regions of the thin copper layer 15 can also be obtained by a conventional patterning process.

In a first alternative in a step S4A in FIG. 3, a copper layer 11 is arranged on the copper layer 10 by electroplating (galvanic copper) or by use of a copper foil. The copper layer 11 contacts the terminal 8 of the component 5. In addition, the copper layer 11 fills the space between the component 5 on the one side and the core 9 and the copper layer 10 on the other side. As a result, the copper layer 11 laterally surrounds the component 5 and contacts the lateral sides of the component 5. Thus, the base structure 4 is composed of the copper layer 10 and the galvanic copper layer 11. The copper foil 10 and the galvanic copper layer 11 can have a thickness of 50 to 100 µm, preferable of 70±5 µm, respectively.

At the other side of the inner component carrier 100, a copper layer 16 is arranged on the thin copper layer 15 by electroplating (galvanic copper). The copper layer 16 can have a thickness of 50 to 100 µm, preferable of 70±5 µm, respectively.

In second alternative in a step S4B in FIG. 4, which is likewise performed after the step S3 in FIG. 3, an electrically insulating layer structure 2 is applied on the thin copper layer 15. Laser vias 31 are formed in this electrically insulating layer structure 2, wherein at least some of the laser vias 31 are connected with the source terminal 7 of the component 5. A copper layer 16 is then arranged on the electrically insulating layer structure 2 and in the vias 31, for example by providing a seed layer and subsequently electroplating (galvanic copper). The copper layer 16 can also comprise a copper foil.

The product obtained after steps 4A and 4B, respectively, is the inner component carrier 100 which can be considered as an inner lead frame made by PCB technologies. The inner component carrier 100 is composed of the base structure 4, the component 5, and optionally the core 9, the copper layer(s) 10, 11 and the copper layer(s) 15, 16. The inner component carrier 100 is formed on panel level, that means the inner component carrier 100 is not formed on wafer level. The inner component carrier 100 can have a planar size of about 7×7 mm² and a height of about 210 µm.

After having completed the inner component carrier 100 in the steps S4A and S4B, respectively, the inner component carrier 100 is connected to or integrated in an outer component carrier such as a printed circuit board which is likewise manufactured on panel level. For example, the inner component carrier 100 can be embedded into a cavity of the outer component carrier. After that, the cavity can be closed by a molding, adhesive or prepreg material, and further conductive layers can be arranged thereon. The inner component carrier 100 and the outer component carrier together form the component carrier 1.

It is possible to manufacture some of the copper layer(s) 10, 11 and of the copper layer(s) 15, 16 not within the base concept depicted in FIGS. 2 to 4 but in later steps during manufacturing the outer component carrier.

According to the present invention, the inner component carrier 100 for example as a PCB lead frame including the component 5 can be integrated into the outer component carrier such as a lower cost PCB. With this concept, a cost saving solution is given by prefabrication of embedded components 5 in an inner PCB lead frame 100 on panel level with utilization of semiconductors as components 5. The concept enables to create thick copper lead frames with common embedding technologies and PCB technologies and realizes a fully packaged component 5. The manufacturing method can be split into manufacturing a high current PCB, i.e. the inner component carrier 100, and a low cost PCB, i.e. the outer component carrier, with higher routing densities. The cost efficiency is improved due to the implementation of a costly lead frame (inner component carrier 100) with the fully packaged component 5 into the cheaper simple PCB (outer component carrier).

Furthermore, a known-good-package (KGP) test capability of 100% of the inner component carrier 100 can be achieved before integrating the same into the outer component carrier such as a final PCB build.

In the embodiment of the component carrier 1 in FIG. 1 (as well as in FIGS. 5 and 6), the copper layers 15, 16 depicted in steps S4A and S4B of FIGS. 2 to 4 are omitted. After having inserted the inner component carrier 100 into the cavity of the outer component carrier, the cavity is closed by a prepreg or molding material 20 which forms a part of the electrically insulating layer structure 2. Vias 21 such as copper-filled laser holes are provided in the molding material 20 to contact the terminals 7 (gate and source) of the component 5.

After that, the top structure 6 is arranged on the prepreg or molding material 20. The top structure 6 can be formed by at least one copper foil such as the copper layer 6a.

Figure 5:
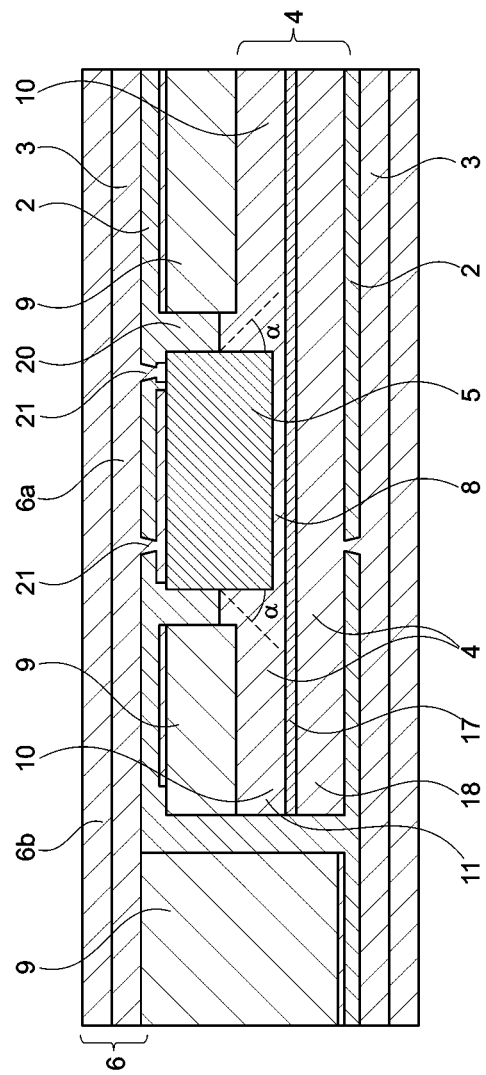
FIG. 5 illustrates a cross-sectional view of a component carrier according to an exemplary embodiment of the invention.

FIG. 5 illustrates a cross-sectional view of a component carrier 1 according to an exemplary embodiment of the invention. The embodiment in FIG. 5 is similar to the embodiment in FIG. 1 except for the following differences. The inner component carrier 100 further comprises a sintered layer 17, for example of copper, and a relative thick copper layer 18 which can be a copper foil having a thickness for example of 300 µm. The sintered layer 17 is sintered/soldered/diffusion soldered on the galvanic copper layer 11 which has been provided in step S4A or step S4B in FIGS. 3 and 4, respectively. The sintered layer 17 can have a thickness of about 50 µm. The copper layer 18 is adhered by means of the sintered layer 17. The sintered layer 17 can be a patterned sintered layer 17 with openings for a contact to the component 5, for example between the drain terminal 8 of the component 5 and the base structure 4.

In the embodiment of FIG. 5, the inner component carrier 100 is composed of the base structure 4, which additionally comprises the sintered layer 17 and the thick copper layer 18, the component 5, and optionally the core 9, the copper layer(s) 10, 11 and the copper layer(s) 15, 16 provided in the base concept depicted in FIGS. 2 to 4.

The core 9 can have a thickness of 70 to 150 µm, preferably of 100 ±5 µm, and the galvanic copper layer 11 can have a thickness of about 50 to 100 µm, preferably of 70±5 µm.

Figure 6:
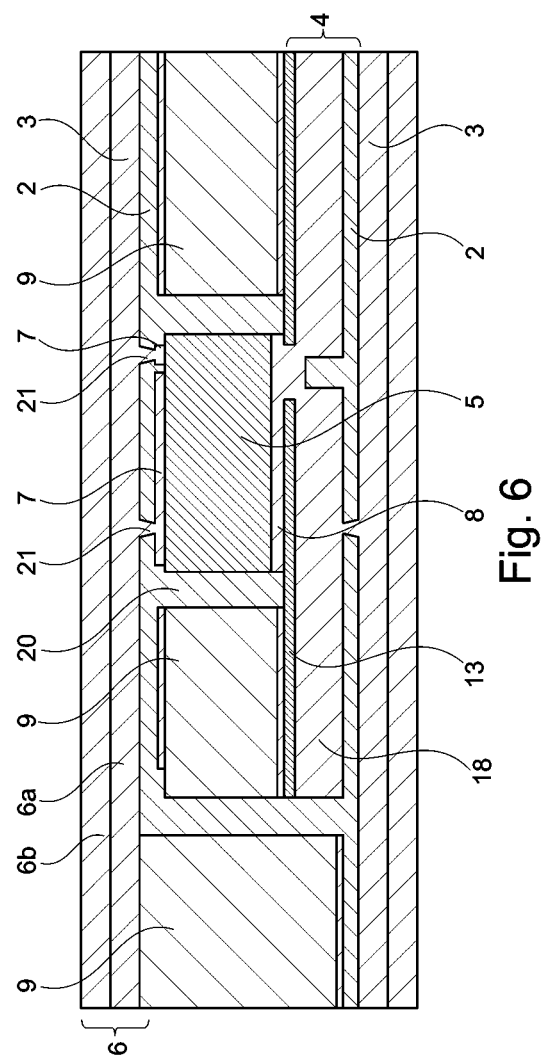
FIG. 6 illustrates a cross-sectional view of a component carrier according to an exemplary embodiment of the invention.
Figure 7:
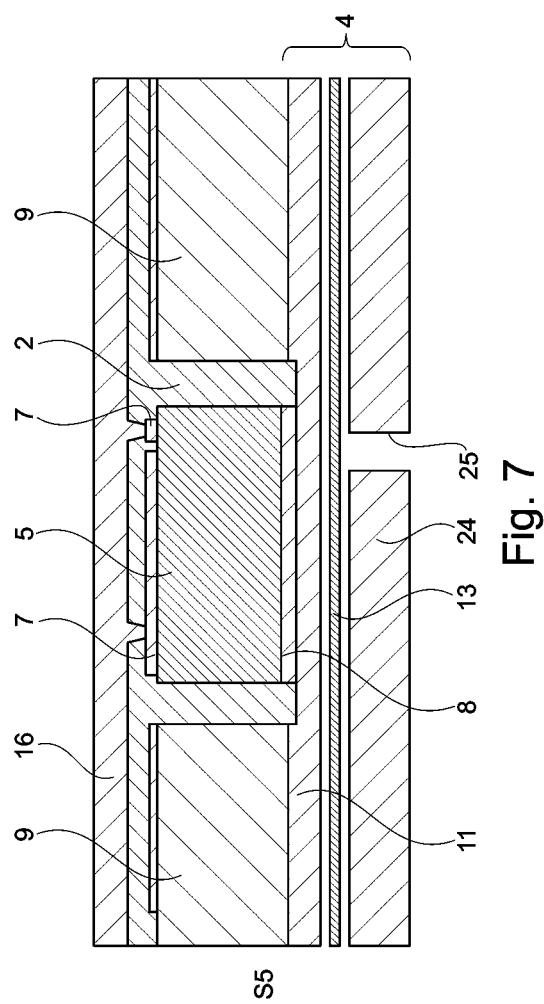
FIG. 7 illustrates a step of a base concept of manufacturing an inner component carrier according to an exemplary embodiment.
Figure 8:
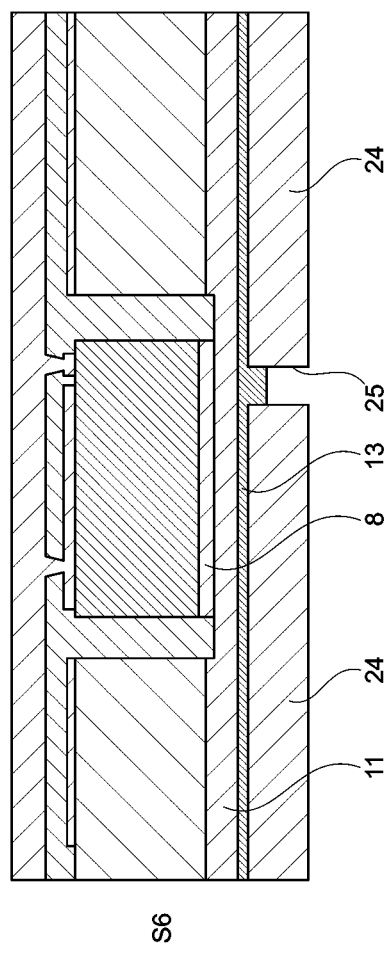
FIG. 8 illustrates a step of the base concept of manufacturing the inner component carrier according to the exemplary embodiment.
Figure 9:
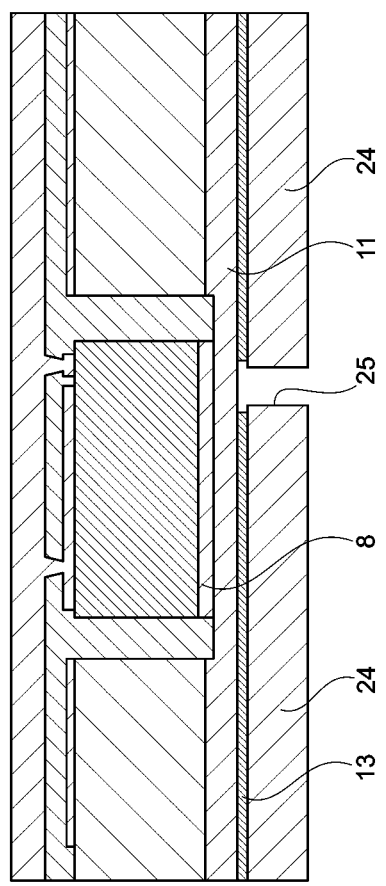
FIG. 9 illustrates a step of the base concept of manufacturing the inner component carrier according to the exemplary embodiment.
Figure 10:
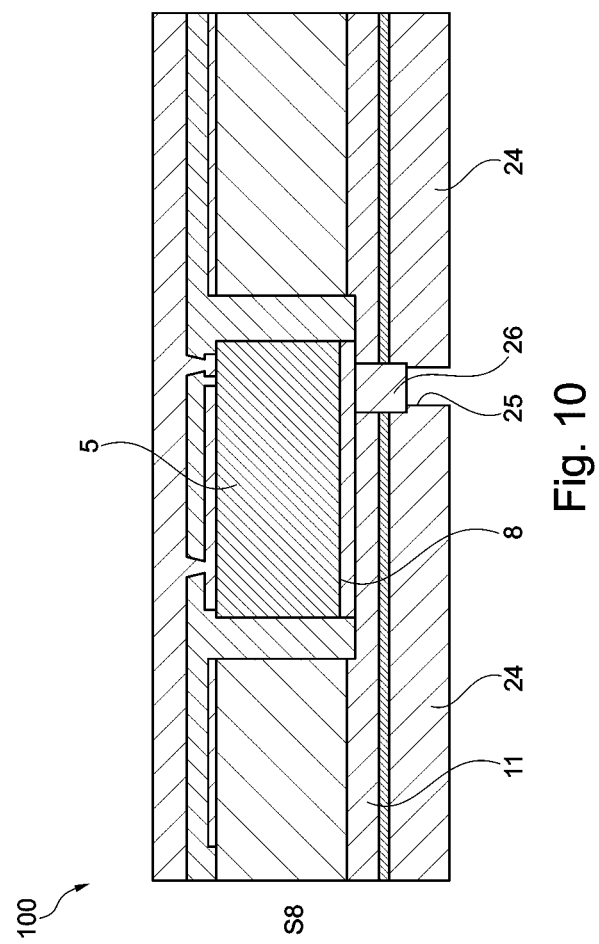
FIG. 10 illustrates a step of the base concept of manufacturing the inner component carrier according to the exemplary embodiment.

FIG. 6 illustrates a cross-sectional view of a component carrier 1 according to an exemplary embodiment of the invention. The embodiment in FIG. 6 is similar to the embodiment in FIG. 1 except for the following differences. The inner component carrier 100 further comprises an adhesive layer 13 and a relative thick copper layer 18 which can be a copper foil having a thickness for example of 300 µm. The adhesive layer 13 is applied on the galvanic copper layer 11 which has been provided in step S4A or step S4B in FIGS. 3 and 4, respectively. The adhesive layer 13 can have a thickness of about 10 µm. The copper layer 18 is adhered by means of the adhesive layer 13.

The adhesive layer 13 can be a patterned adhesive layer 13 with openings for a contact to the component 5, for example between the drain terminal 8 of the component 5 and the base structure 4.

In the embodiment of FIG. 6, the inner component carrier 100 is composed of the base structure 4, which in turn comprises the adhesive layer 13 and the thick copper layer 18, the component 5, and optionally the core 9, the copper layer(s) 10, 11 and the copper layer(s) 15, 16 provided in the base concept depicted in FIGS. 2 to 4.

Furthermore, the component 5 in the embodiment of FIG. 6 is connected to the base structure 4 so as to completely protrude from the base structure 4 and so as to be laterally completely covered by the electrically insulating material of the stack.

FIGS. 7 to 10 illustrate steps of a base concept of manufacturing an inner component carrier 100 according to the exemplary embodiment.

In a step S5, a state before lamination is shown. Reference sign 13 designates an adhesive layer, and reference sign 24 designates a relatively thick copper foil which comprises a mechanically drilled hole 25. The adhesive layer 13 is placed between the copper foil 24 and a copper layer, for example a copper layer 11 which is manufactured similar to the copper layer 11 in steps S4A or S4B in FIGS. 3 and 4, respectively.

In a step S6, a state after lamination is shown. A part of adhesive material of the adhesive layer 13 entered the hole 25.

In a step S7, a desmearing process is carried out where the part of the adhesive material of the adhesive layer 13 is removed from the hole 25 to clean the hole 25. The adhesive layer 13 is removed up to the copper layer 11. The desmearing process can be carried out by plasma etching.

In a step S8, a copper layer 26 is filled in the hole 25 to contact the copper layer 11 of the component 5, that means to electrically connect the terminal 8 of the component 5 to the copper foil 24. At the end, the inner component carrier 100 is completed.

Figure 11:
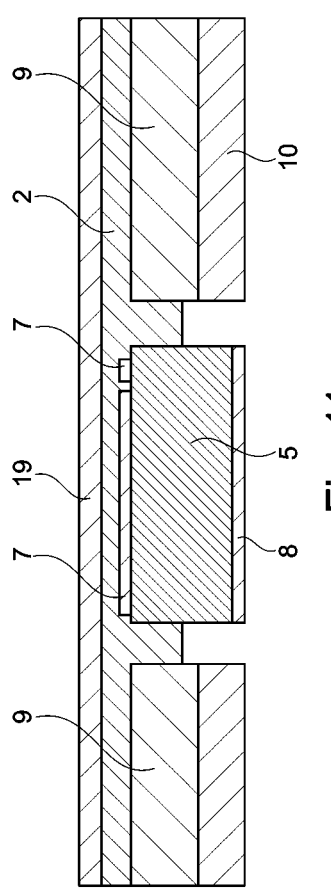
FIG. 11 illustrates a step of a base concept of manufacturing an inner component carrier according to an exemplary embodiment.
Figure 12:
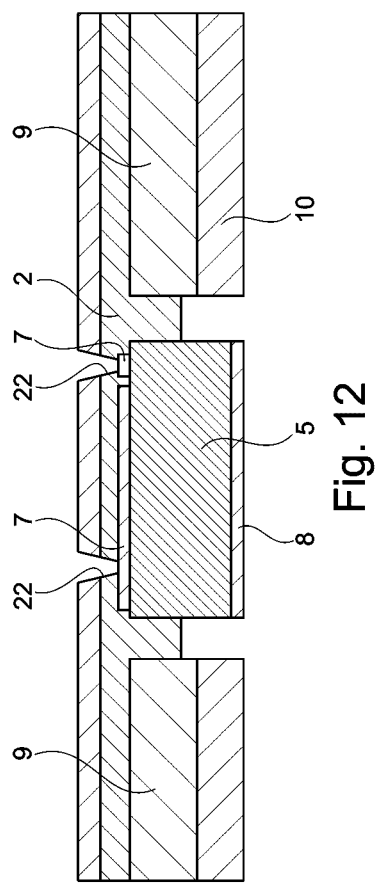
FIG. 12 illustrates a step of the base concept of manufacturing the inner component carrier according to the exemplary embodiment.
Figure 13:
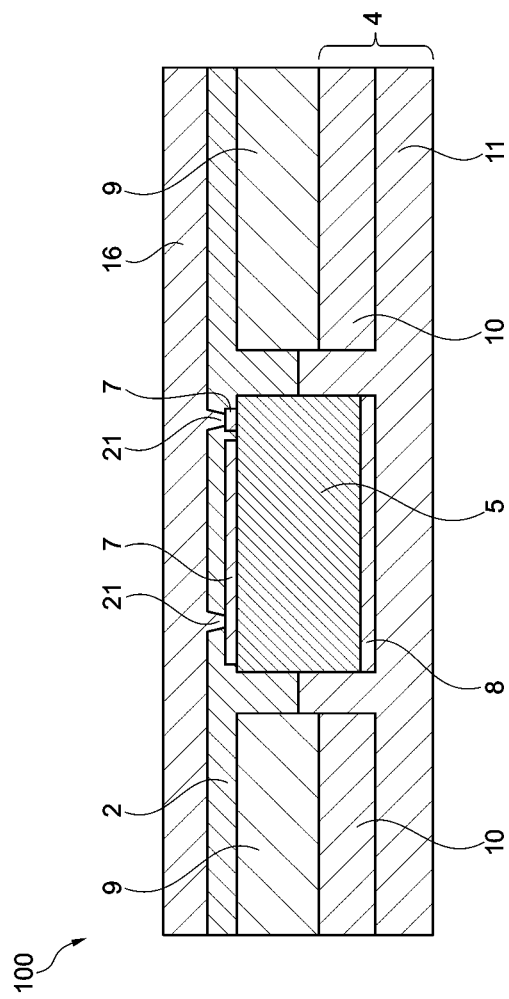
FIG. 13 illustrates a step of the base concept of manufacturing the inner component carrier according to the exemplary embodiment.

FIGS. 11 to 13 illustrate steps of a base concept of manufacturing an inner component carrier 100 according to an exemplary embodiment.

The inner component carrier 100 in FIG. 11 starts out from step S2 in FIG. 2. In this case, the component carrier 1 is manufactured using the temporary carrier 14 which is temporarily attached to a main surface of the component 5 directed to the top structure 6. The temporary carrier 14, which is shown in FIG. 2, is removed in FIG. 11. In place of the temporary carrier 14, an electrically insulating layer structure 2 is applied in place of the temporary carrier 14. The electrically insulating layer structure 2 can be made of a molding material or a prepreg material. A copper layer 19 is applied on this electrically insulating layer structure 2. This copper layer 19 can be a copper foil or a thin copper layer similar to the thin copper layer 15 in FIG. 3, which is applied chemically, electroless or by sputtering.

Alternatively, the inner component carrier 100 in FIG. 11 can start out from a situation which differs from the situation in step S2 in FIG. 2 in that the temporary carrier 14 is not arranged on the core 9 but on the copper layer 10, and the component is arranged face-up in the cavity 91, i.e., the drain terminal 8 is adhered to the temporary carrier 14. In this case, the component carrier 1 is manufactured by use of the temporary carrier 14 which is temporarily attached to a main surface of the component 5 directed to the base structure 4.

After that, an electrically insulating layer structure 2 is filled in the cavity 91, the temporary carrier 14 is removed and the copper layer 19 is arranged on the electrically insulating layer structure 2 so as to obtain the intermediate inner component carrier as shown in FIG. 11.

In FIG. 12, the copper layer 19 and the underlying electrically insulating layer structure 2 are patterned, for example by conventional photo-imageable or lithographic processes and laser drilling processes, respectively. As a result, holes such as conical holes are formed in the copper layer 19 and the underlying electrically insulating layer structure 2.

It is possible to perform a laser ablation process in order to remove a part of the electrically insulating layer structure 2 around the component 5.

In FIG. 13, the holes 22 are filled by an electrically conductive material such as copper so that vias 21 are formed to contact the terminals 7 of the component 5, and a copper layer 16 is arranged on top.

A copper layer 11 is arranged on the copper layer 10 by electroplating (galvanic copper) or by use of a copper foil. The copper layer 11 contacts the terminal 8 of the component 5. In addition, the copper layer 11 fills the space between the component 5 on the one side and the core 9 and the copper layer 10 on the other side. As a result, the copper layer 11 laterally surrounds the component 5 and contacts the lateral sides of the component 5.

Thus, the base structure 4 is composed of the copper layer 10 and the galvanic copper layer 11.

A copper layer 16 is arranged on the electrically insulating layer structure 2. The copper layer 16 can be a copper foil, or it can be a galvanic copper layer which is applied by electroplating on an underlying seed layer.

For example, the copper layer 16, the copper layer 10 and the copper layer 11 can each have a thickness between 50 and 100 µm, preferable of 70±5 µm.

FIGS. 14 to 16 illustrate steps of a base concept of manufacturing an inner component carrier 100 according to an exemplary embodiment.

In a step S11, a core 9 made of an insulating material is provided, which has a cavity 91. The cavity 91 in the board can be provided by mechanically drilling. A copper layer 10 is arranged on the core 9. The copper layer 10 can be a copper foil, for example in a thickness of 70 µm. The core 9 with the copper layer 10 thereon can be a prefabricated board. The core 9 has another copper layer 23 at the side opposite to the copper layer 10.

A temporary carrier 14, in particular a sticky tape, is attached to the other copper layer 23. A component 5 is placed on the temporary carrier 14 within the cavity 91. In the present embodiment, the component 5 is a MOSFET having a drain terminal 8 at one side and a source terminal 7 and a gate terminal 7 at the opposite side. The component 5 is placed with its source terminal 7 and its gate terminal 7 onto the temporary carrier 14 within the cavity 91 so that the drain terminal 8 is exposed at the top. The component 5 is placed face-down in the cavity 91, that means the source terminal 7 and the gate terminal 7 are arranged on the temporary carrier 14.

In a step S12, the component 5 is fixed by a material of an electrically insulating layer structure 2 in the cavity 91. This material of the electrically insulating layer structure 2 can be an adhesive or a molding material. Alternatively, if the board comprising the core 9 and the copper layer 10 is made of a prepreg material, the board can be laminated by means of pressure and/or heat so that the prepreg material of the core 9 is molten and enters the cavity 91.

After curing the prepreg material of the core 9, the component 5 is fixed within the cavity 91.

It is possible to perform a laser ablation process in order to remove a part of the electrically insulating layer structure 2 around the component 5.

In a step S13, the temporary carrier 14 is removed. In place of the temporary carrier 14, a thin copper layer 15 (seed layer) can be applied to the other copper layer 23, the electrically insulating layer structure 2 and the terminals 7 of the component 5. The thin copper layer 15 can be applied chemically, electroless or by sputtering.

The thin copper layer 15 can be composed of two horizontal regions, wherein a first region (at the left-hand side in step S13 of FIG. 15) is connected to the gate terminal 7 of the component 5, that means a gate line is realized in the thin copper layer 15. A second region (at the right-hand side in step S13 of FIG. 15) of the thin copper layer 15 is connected to the source terminal 7 of the component 5. The first and the second region of the thin copper layer 15 can also be obtained by a conventional patterning process.

In a step S14, a partial electrically insulating layer structure 2 is applied on the thin copper layer 15 to cover the first region of the thin copper layer 15. This electrically insulating layer structure 2 can be provided with vias 31. This partial electrically insulating layer structure 2 can be applied by an inkjet process, by screen-printing, by a three-dimensional printing process, etc.

A copper layer 16 is arranged by electroplating (galvanic copper) on this electrically insulating layer structure 2 and on the second region of the thin copper layer 15. The copper layer 16 can optionally be patterned by conventional lithography processes.

A copper layer 11 is arranged on the copper layer 10 by electroplating (galvanic copper) or by use of a copper foil. In addition, the copper layer 11 fills the space between the component 5 on the one side and the core 9 and the copper layer 10 on the other side. As a result, the copper layer 11 laterally surrounds the component 5 and contacts the lateral sides of the component 5. The copper layer 11 further contacts the terminal 8 of the component 5.

Thus, the base structure 4 is composed of the copper layer 10 and the galvanic copper layer 11.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier, comprising:
   a stack comprising at least one electrically insulating layer structure and/or at least one electrically conductive layer structure;
   a heat removing and electrically conductive base structure comprising a copper foil and a layer of galvanic copper;
   a component which is connected to the base structure so as to at least partially protrude from the base structure and so as to be laterally at least partially covered by an electrically insulating material of the stack, wherein the layer of galvanic copper laterally surrounds the component and contacts the lateral sides of the component; and
   an electrically conductive top structure on or above a top main surface of the component.

2. The component carrier according to claim 1, wherein the component is connected to the base structure for heat spreading at least with a heat spreading angle of 45°.

3. The component carrier according to claim 1, wherein the base structure has a thickness of larger than 100 μm; and/or the top structure has a thickness of at least 50 μm; and/or the top structure has a thickness being smaller than a thickness of the base structure.

4. The component carrier according to claim 1, wherein the component has at least one terminal at a top main surface and at least one terminal at a bottom main surface, wherein the at least one terminal at the bottom main surface is connected to the base structure and the at least one terminal on the top surface is connected to the top structure.

5. The component carrier according to claim 1, wherein the component is laterally surrounded at least partially by a core.

6. The component carrier according to claim 1, wherein the top structure comprises a copper foil.

7. The component carrier according to claim 1, wherein at least 10% of a sidewall of the component is covered with a material of the base structure; and/or at least 10% of a sidewall of the component is covered with an electrically insulating material of the stack.

8. The component carrier according to claim 1, wherein a patterned adhesive or sintered layer is arranged within the base structure and provides an electric and/or thermal contact for the component.

9. The component carrier according to claim 1, further comprising at least one of the following features:
   the component carrier comprises at least one component being surface mounted on and/or embedded in the component carrier, wherein the at least one component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
   wherein at least one of the electrically conductive layer structures of the component carrier comprises at least one of the group consisting of copper, aluminum, nickel, silver, gold, palladium, and tungsten, any of the mentioned materials being coated with supra-conductive material such as graphene;
   wherein the electrically insulating layer structure comprises at least one of the group consisting of reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
   wherein the component carrier is shaped as a plate;
   wherein the component carrier is configured as one of the group consisting of a printed circuit board, a substrate, and an interposer;
   wherein the component carrier is configured as a laminate-type component carrier.

10. A method of manufacturing a component carrier, comprising:
   providing a stack comprising at least one electrically insulating layer structure and/or at least one electrically conductive layer structure;

forming a heat removing and electrically conductive base structure comprising a copper foil and a layer of galvanic copper;

connecting a component to the base structure so that the component at least partially protrudes from the base structure and is covered on its sidewalls at least partially by an electrically insulating material of the stack, wherein the layer of galvanic copper laterally surrounds the component and contacts the lateral sides of the component; and forming an electrically conductive top structure electrically contacting a top main surface of the component.

11. The method according to claim 10, wherein an inner component carrier is formed on panel level in the step of connecting the component to the base structure, and the inner component carrier is embedded on panel level in a cavity of an outer component carrier.

12. The method according to claim 10, wherein the component carrier is manufactured using a temporary carrier which is temporarily attached to a main surface of the component directed to the top structure.

13. The method according to claim 10, wherein the component carrier is manufactured by use of a temporary carrier which is temporarily attached to a main surface of the component directed to the base structure.

14. The method according to claim 10, wherein the component carrier is manufactured by a batch process on panel level.

* * * * *